(12) United States Patent
Kimura et al.

(10) Patent No.: US 11,251,770 B2
(45) Date of Patent: Feb. 15, 2022

(54) CRYSTAL DEVICE AND ELECTRONIC APPARATUS USING THIS CRYSTAL DEVICE

(71) Applicant: KYOCERA Corporation, Kyoto (JP)

(72) Inventors: Eiji Kimura, Higashiomi (JP); Tsuyoshi Teramura, Moriyama (JP)

(73) Assignee: KYOCERA CORPORATION, Kyoto (JP)

( * ) Notice: Subject to any disclaimer, the term of this patent is extended or adjusted under 35 U.S.C. 154(b) by 371 days.

(21) Appl. No.: 16/351,141

(22) Filed: Mar. 12, 2019

(65) Prior Publication Data

US 2019/0312566 A1    Oct. 10, 2019

(30) Foreign Application Priority Data

Apr. 4, 2018    (JP) .............................. JP2018-072504

(51) Int. Cl.
| | | |
|---|---|---|
| *H03H 9/10* | (2006.01) | |
| *H03H 9/02* | (2006.01) | |
| *H03H 9/19* | (2006.01) | |
| *H03H 9/05* | (2006.01) | |

(52) U.S. Cl.
CPC ...... *H03H 9/1021* (2013.01); *H03H 9/02102* (2013.01); *H03H 9/02133* (2013.01); *H03H 9/0509* (2013.01); *H03H 9/0552* (2013.01); *H03H 9/19* (2013.01)

(58) Field of Classification Search
CPC .... H03H 9/1021; H03H 9/02102; H03H 9/19; H03H 9/0509; H03H 9/0552; H03H 9/02133; H03H 9/0547; G01K 7/32; G01K 7/18; G01K 7/22; G01K 7/14
See application file for complete search history.

(56) References Cited

U.S. PATENT DOCUMENTS

| | | | |
|---|---|---|---|
| 7,266,869 B2 * | 9/2007 | Hatanaka | ................ H01L 24/97 |
| | | | 29/25.35 |
| 9,548,717 B2 * | 1/2017 | Takase | ................ H03H 9/1021 |
| 2010/0290206 A1 | 11/2010 | Sugawara et al. | |
| 2015/0123737 A1 | 5/2015 | Yokoo et al. | |
| 2015/0295557 A1 | 10/2015 | Takase | |

FOREIGN PATENT DOCUMENTS

| | | |
|---|---|---|
| CN | 104639041 A | 5/2015 |
| CN | 104885361 A | 9/2015 |
| JP | 2010-268193 A | 11/2010 |

(Continued)

OTHER PUBLICATIONS

Machine translation of JP2013-146003.*

*Primary Examiner* — Jeffrey M Shin
(74) *Attorney, Agent, or Firm* — Volpe Koenig

(57) ABSTRACT

A crystal device includes a rectangular shaped substrate, a mounting frame which is along an outer circumferential edge of a lower surface of the substrate on its short-side sides and configures a recessed part, electrode pads on an upper surface of the substrate, connection pads on the lower surface of the substrate in the mounting frame, a crystal element mounted on the electrode pads, a temperature sensing element mounted on the connection pads, and a lid air-tightly sealing the crystal element. The electrode pads and the recessed part do not overlap in a plane perspective view.

11 Claims, 10 Drawing Sheets

(56) References Cited

FOREIGN PATENT DOCUMENTS

| | | | |
|---|---|---|---|
| JP | 2011-211340 A | | 10/2011 |
| JP | 2013-146003 A | | 7/2013 |
| JP | 2013146003 A | * | 7/2013 |
| JP | 2016-072645 A | | 5/2016 |
| WO | 2014/077278 A1 | | 5/2014 |

* cited by examiner

CRYSTAL DEVICE AND ELECTRONIC APPARATUS USING THIS CRYSTAL DEVICE

TECHNICAL FIELD

The present disclosure relates to a crystal device used in an electronic apparatus or the like and an electronic apparatus using that crystal device.

BACKGROUND ART

A crystal device utilizes a piezoelectric effect of a crystal element to generate a specific frequency. For example, a crystal device provided with a package having a substrate, a first frame provided on an upper surface of the substrate in order to provide a first recessed part, and a second frame provided on a lower surface of the substrate in order to provide a second recessed part, a crystal element mounted on electrode pads provided on the upper surface of the substrate, and a temperature sensing element mounted on connection pads provided on the lower surface of the substrate has been proposed (see for example Patent Literature 1).

CITATION LIST

Patent Literature

Patent Literature 1: Japanese Patent Publication No. 2011-211340A

SUMMARY OF INVENTION

A crystal device according to one aspect of the present disclosure includes a rectangular shaped substrate, amounting frame which is along an outer circumferential edge of a lower surface of the substrate on its short-side sides and configures a recessed part, electrode pads on an upper surface of the substrate, connection pads on the lower surface of the substrate in the mounting frame, a crystal element mounted on the electrode pads, a temperature sensing element mounted on the connection pads, and a lid air-tightly sealing the crystal element. The electrode pads and the recessed part do not overlap in a plane perspective view.

DESCRIPTION OF EMBODIMENTS

Figure 1:
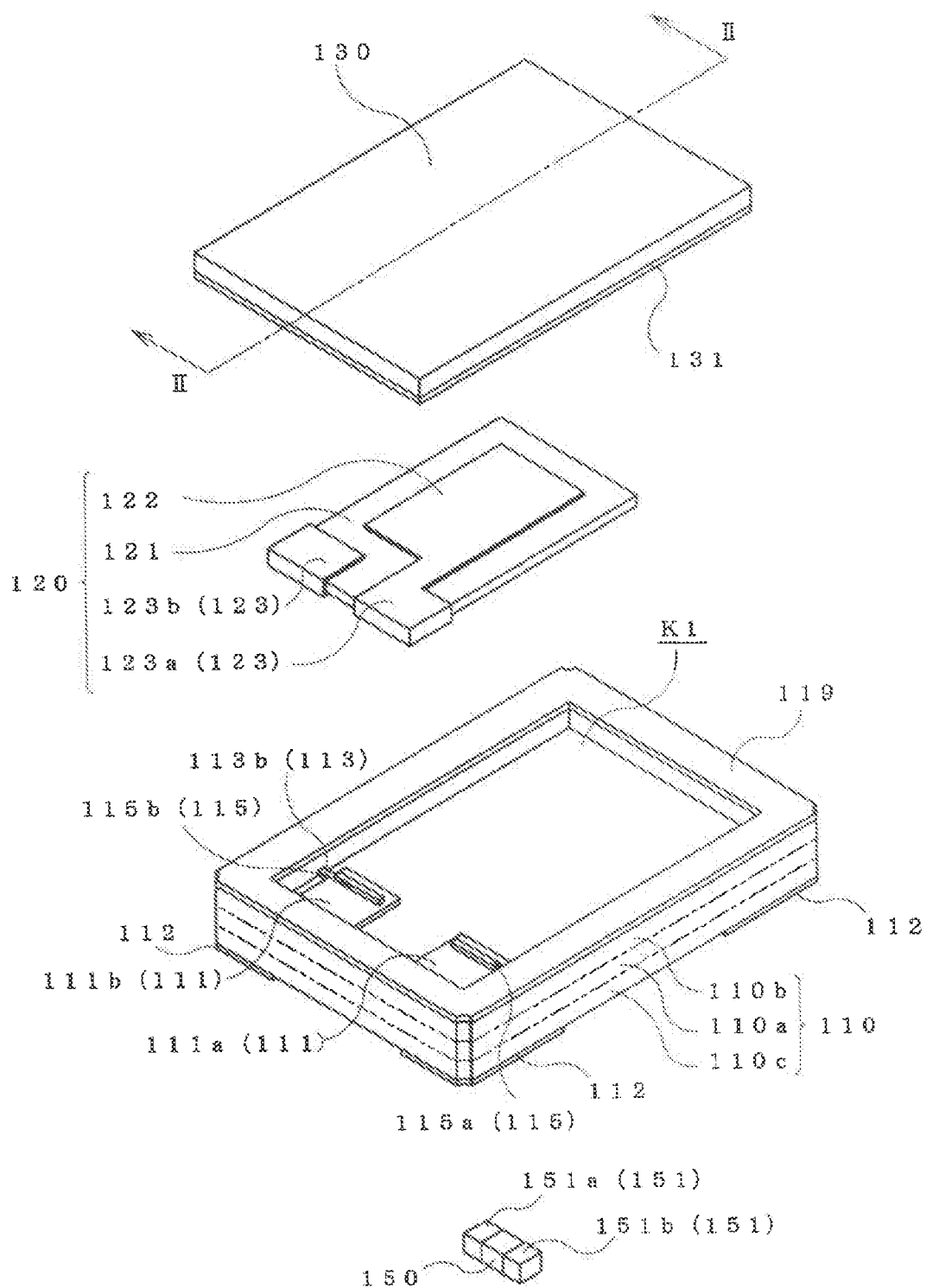
FIG. 1 is a disassembled perspective view showing a crystal device according to the present embodiment.

A crystal device in the present embodiment, as shown in FIG. 1 to FIGS. 4A and 4B, includes a package 110, a crystal element 120 bonded to the upper surface of the package 110, and a temperature sensing element 150 bonded to the lower surface of the package 110. In the package 110, a holding part K1 surrounded by an upper surface of the substrate 110a and an inner side surface of a frame 110b is formed. Further, a recessed part K2 surrounded by a lower surface of the substrate 110a and an inner side surface of a mounting frame 110c is formed. Such a crystal device is used for outputting reference signals used in an electronic apparatus and the like. Note that, in the perspective plan views in FIGS. 3A and 3B and FIGS. 4A and 4B, parts in the configurations which cannot be directly viewed are drawn by solid lines. Further, among those configurations, parts covered by the other members are drawn by broken lines. The same is true in FIGS. 7A and 7B to FIGS. 9A and 9B which will be explained later.

The substrate 110a is rectangular shaped and functions as the mounting member for mounting the crystal element 120 mounted on the upper surface and the temperature sensing element 150 mounted on the lower surface. The substrate 110a is provided with electrode pads 111 for mounting the crystal element 120 on its upper surface and with connection pads 117 for mounting the temperature sensing element 150 on its lower surface. Further, along one side of the substrate 110a, a first electrode pad 111a and second electrode pad 111b for bonding the crystal element 120 are provided.

The substrate 110a includes an insulation layer made of for example alumina ceramic or glass ceramic or another ceramic material. The substrate 110a may be one using a single insulation layer or one formed by stacking a plurality of insulation layers. On the surface and in the internal portion of the substrate 110a, interconnect patterns 113 and via conductors 114 for electrically connecting the electrode pads 111 provided on the upper surface and the external terminals 112 provided on the lower surface of the mounting frame 110c are provided. Further, on the surface and in the internal portion of the substrate 110a, via conductors 114 and connection patterns 118 for electrically connecting the connection pads 117 provided on the lower surface and the external terminals 112 provided on the lower surface of the mounting frame 110c are provided.

The frame 110b is arranged along the outer circumferential edge of the upper surface of the substrate 110a and is used for forming the holding part K1 in the upper surface of the substrate 110a. The frame 110b includes for example alumina ceramic or glass ceramic or another ceramic material and is formed integrally with the substrate 110a.

The mounting frame 110c is arranged along the outer circumferential edge of the lower surface of the substrate 110a and is used for forming the recessed part K2 in the lower surface of the substrate 110a. The mounting frame 110c is made of for example alumina ceramic or glass ceramic or another ceramic material and is formed integrally with the substrate 110a and frame 110b. At the four corners of the lower surface of the mounting frame 110c, the external terminals 112 are provided. Further, two among the four external terminals 112 are electrically connected with the crystal element 120, while the remaining two among the four external terminals 112 are electrically connected with the temperature sensing element 150.

A line which passes through the centers of the short sides of the substrate 110a and is parallel to the long sides is defined as an axial line L1, while a line which passes through the centers of the long sides of the substrate 110a and is parallel to the short sides is defined as an axial line L2. An intersecting point of these axial line L1 and axial line L2 is defined as a first center point P1. Further, a line which passes through the centers of the long sides of the recessed part K2 and is parallel to the long sides of the substrate 110a is defined as the axial line L1, while a line which passes through the centers of the short sides of the recessed part K2 and is parallel to the short sides of the substrate 110a is defined as an axial line L3. An intersecting point of these axial line L1 and axial line L3 is defined as a second center point P2.

Figure 4A:
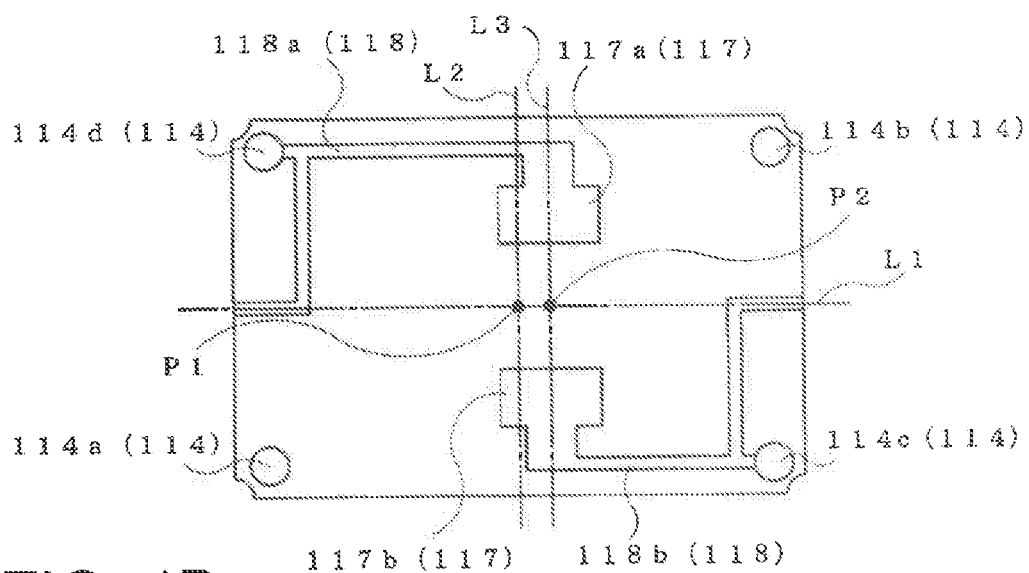
FIG. 4A is a perspective plan view when the substrate of the package configuring the crystal device according to the present embodiment is viewed from the upper surface.
Figure 4B:
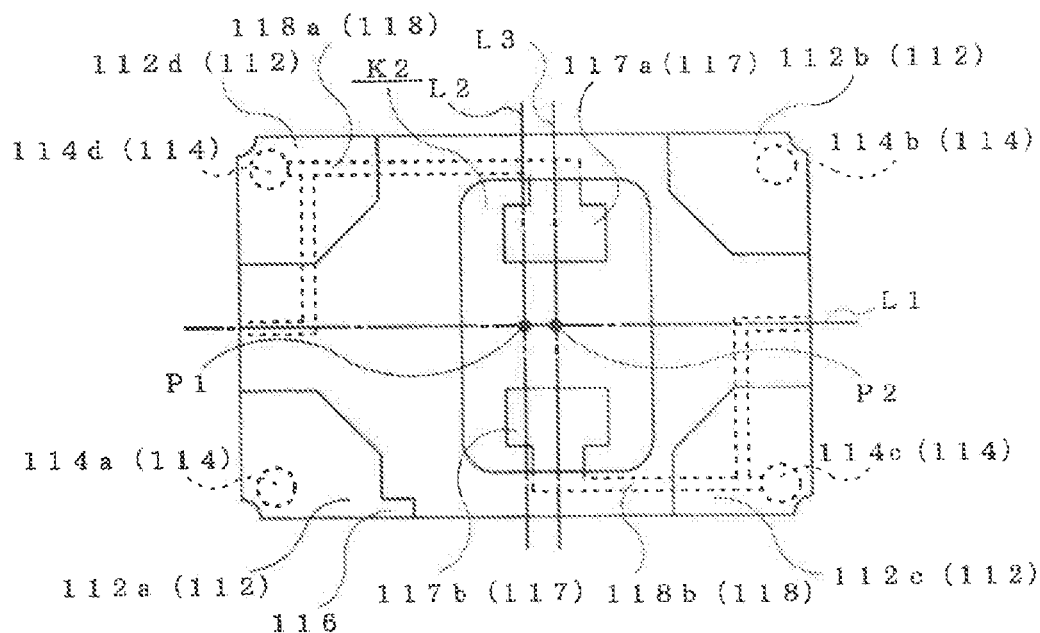
FIG. 4B is a perspective plan view when the crystal device according to the present embodiment is viewed from the upper surface.
Figure 5:
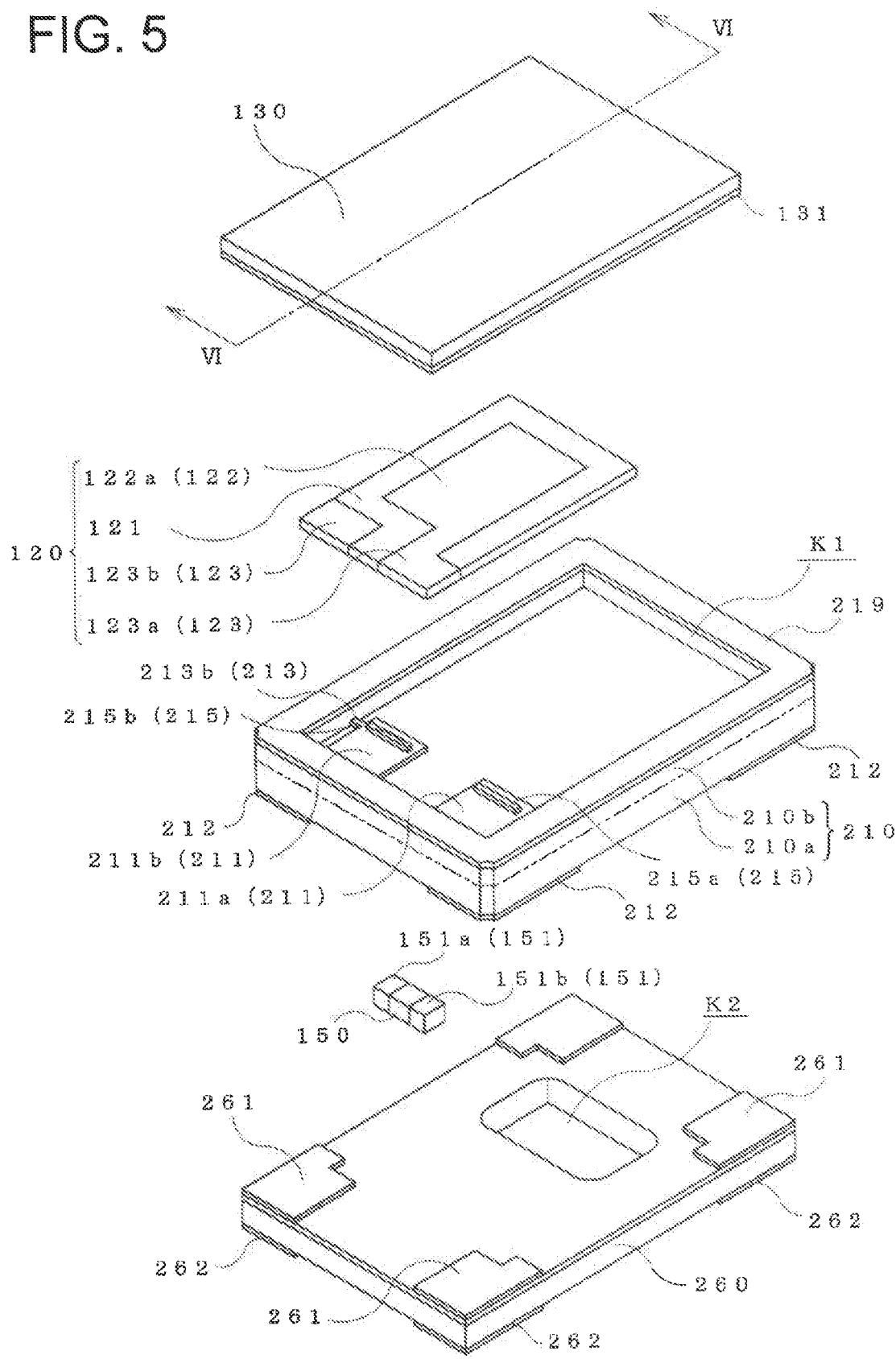
FIG. 5 is a disassembled perspective view showing a crystal device according to a first modification of the present embodiment.

Further, a first external terminal 112a and second external terminal 112b which are electrically connected to the crystal element 120, as shown in FIG. 4B, are provided so as to be positioned at the diagonal corners of the lower surface of the mounting frame 110c. Further, a third external terminal 112c and fourth external terminal 112d which are electrically connected to the temperature sensing element 150 are provided at the mounting frame 110c so that their positions are different from those where the first external terminal 112a and second external terminal 112b connected with the crystal element 120 are provided.

The electrode pads 111 are for mounting the crystal element 120. The electrode pads 111 are provided as a pair on the upper surface of the substrate 110a and are provided adjacent to each other along one side of the substrate 110a. The electrode pads 111, as shown in FIGS. 3A and 3B and FIGS. 4A and 4B, are electrically connected through the interconnect patterns 113 provided on the upper surface of the substrate 110a and via conductors 114 with the external terminals 112 provided on the lower surface of the mounting frame 110c.

Figure 3A:
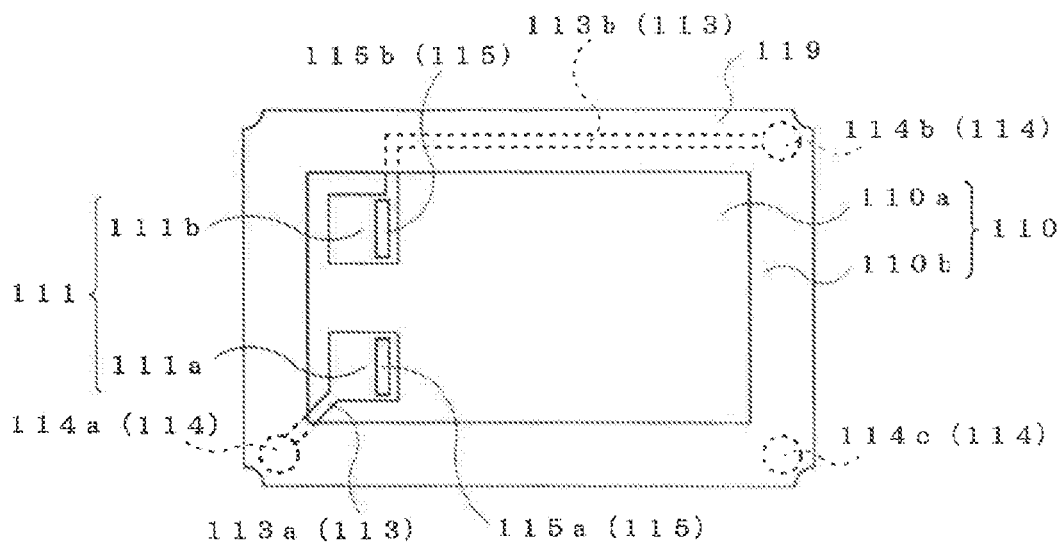
FIG. 3A is a perspective plan view when a package configuring the crystal device according to the present embodiment is viewed from the upper surface.
Figure 3B:
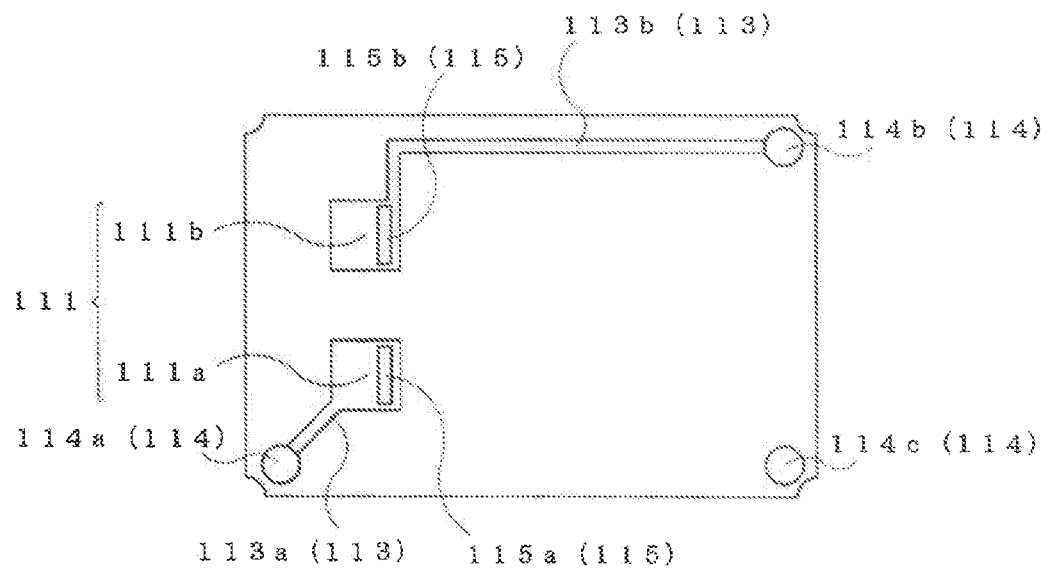
FIG. 3B is a perspective plan view when a substrate of the package configuring the crystal device according to the present embodiment is viewed from the upper surface.

The electrode pads 111, as shown in FIGS. 3A and 3B, are configured by a first electrode pad 111a and a second electrode pad 111b. Further, the external terminals 112, as shown in FIG. 4B, are configured by the first external terminal 112a, second external terminal 112b, third external terminal 112c, and fourth external terminal 112d. The via conductors 114 are configured by a first via conductor 114a, second via conductor 114b, third via conductor 114c, and fourth via conductor 114d.

Further, the interconnect patterns 113 are configured by a first interconnect pattern 113a and second interconnect pattern 113b. The first electrode pad 111a is electrically connected to one end of the first interconnect pattern 113a provided on the substrate 110a. Further, the other end of the first interconnect pattern 113a is electrically connected through the first via conductor 114a with the first external terminal 112a. Accordingly, the first electrode pad 111a is electrically connected with the first external terminal 112a. The second electrode pad 111b is electrically connected with one end of the second interconnect pattern 113b provided on the substrate 110a. Further, the other end of the second interconnect pattern 113b is electrically connected through the second via conductor 114b with the second external terminal 112b.

The external terminals 112 are for mounting on a mounting substrate of an electronic apparatus or the like. The external terminals 112 are provided on the lower surface of the mounting frame 110c. Two terminals among the external terminals 112 are respectively electrically connected with the pair of electrode pads 111 provided on the upper surface of the substrate 110a. The remaining two terminals among the external terminals 112 are electrically connected with the two connection pads 117 provided on the lower surface of the substrate 110a. Further, the third external terminal 112c is connected with a mounting pad connected to the ground potential as the reference potential on the mounting substrate of the electronic apparatus or the like. The lid 130 bonded to the sealing-use conductor pattern 119 is connected to the third external terminal 112c of the ground potential. Accordingly, a shielding property in the holding part K1 by the lid 130 is improved.

The interconnect patterns 113 are provided on the upper surface of the substrate 110a and are led out from the electrode pads 111 toward the nearby via conductors 114. Further, the interconnect patterns 113, as shown in FIGS. 3A and 3B, are configured by a first interconnect pattern 113a and second interconnect pattern 113b.

The via conductors 114 are provided in the internal portion of the substrate 110a, the frame 110b and/or the mounting frame 110c. Their two ends are electrically connected with the interconnect patterns 113, the connection patterns 118, sealing-use conductor pattern 119 or the external terminals 112. The via conductors 114 are provided by filling a conductor in the internal portions of the via holes provided in the substrate 110a, the frame 110b and/or the mounting frame 110c. Further, the via conductors 114, as shown in FIGS. 3A and 3B and FIGS. 4A and 4B, are configured by the first via conductor 114a, second via conductor 114b, third via conductor 114c, and fourth via conductor 114d.

Convex portions 115 are respectively provided on the pair of electrode pads 111 so as to be aligned on the same straight line parallel to one side of the substrate 110a. By providing these in this way, it is possible to make lead electrodes 123 of the crystal element 120 contact the pair of convex portions 115 while mounting the element on the electrode pads 111 and thereby mount the crystal element 120 in a stable state without inclination.

A projection part 116 is provided at one of the external terminals 112 so as to extend out in the long side direction of the substrate 110a. The projection part 116 functions as a mark of the external terminal 112, therefore the directions and types of the external terminals 112 can be differentiated.

It is used when mounting onto a mother board of an electronic apparatus or the like.

The connection pads 117 are rectangular and are used for mounting the temperature sensing element 150 which will be explained later. Further, the connection pads 117, as shown in FIGS. 4A and 4B, are configured by a first connection pad 117a and second connection pad 117b. Further, a conductive bonding material 170 is also provided between the lower surfaces of the connection pads 117 and connection terminals 151 of the temperature sensing element 150.

Here, the size of the connection pads 117 will be explained by taking as an example a case where the dimension of the long side of the substrate 110a in a planar view is 1.2 to 2.5 mm and the dimension of the short side of the substrate 110a in a planar view is 1.0 to 2.0 mm. The length of the sides of the connection pads 117 which are parallel to the short sides of the substrate 110a is 0.2 to 0.4 mm, and the length of the sides which are parallel to the long sides of the substrate 110a becomes 0.25 to 0.55 mm. Further, the length between the first connection pad 117a and the second connection pad 117b becomes 0.1 to 0.3 mm.

The second connection pad 117b and the third external terminal 112c are connected by the second connection pattern 118b which is provided on the lower surface of the substrate 110a and third via conductor 114c. Further, the first connection pad 117a and the fourth external terminal 112d are connected by the first connection pattern 118a which is provided on the lower surface of the substrate 110a and fourth via conductor 114d.

The connection patterns 118 are provided on the lower surface of the substrate 110a and are led out from the connection pads 117 toward the via conductors 114, and is connected through the via conductors 114 with the predetermined external terminals 112. Further, the connection patterns 118, as shown in FIGS. 4A and 4B, are configured by the first connection pattern 118a and second connection pattern 118b.

The connection patterns 118 are for electrically connecting the adjacent connection pads 117 to the via conductors 114. The connection patterns 118 are configured by the first connection pattern 118a and second connection pattern 118b. The first connection pattern 118a is electrically connected with the first connection pad 117a, while the second connection pattern 118b is electrically connected with the second connection pad 117b.

Further, the first connection pattern 118a, as shown in FIGS. 3A and 3B and FIGS. 4A and 4B, in a plane perspective view, is provided so as to be positioned between the pair of electrode pads 111. Further, by doing this, heat transferred from the crystal element 120 is transferred from the electrode pads 111 through the substrate 110a positioned just below the same and through the first connection pattern 118a to the first connection pad 117a. Accordingly, such a crystal device can make the heat conduction route further shorter, therefore the temperature of the crystal element 120 and the temperature of the temperature sensing element 150 become similar and it becomes possible to further reduce a difference between the temperature obtained by converting the voltage output from the temperature sensing element 150 and an actual temperature around the crystal element 120.

The sealing-use conductor pattern 119, when bonding with the lid 130 through a bonding member 131, functions to make the wettability of the bonding member 131 better. The sealing-use conductor pattern 119, as shown in FIGS. 3A and 3B and FIGS. 4A and 4B, is electrically connected through the third via conductor 114c with the third external terminal 112c. The sealing-use conductor pattern 119, for example, is formed to a thickness of for example 10 to 25 μm by successively nickel plating and gold plating the surface of a connection pattern made of for example tungsten or molybdenum in a form surrounding the upper surface of the frame 110b in a ring shape.

The recessed part K2 is provided at a position where it does not overlap the electrode pads 111 when viewed on a plane. By the electrode pads 111 and the recessed part K2 being provided at the positions where they do not overlap in this way, the thickness in the vertical direction at the position where the electrode pads 111 are provided formed by the substrate 110a and the mounting frame 110c added together is secured, therefore stress generated due to expansion or contraction of the substrate 110a along with a change of the surrounding temperature of the crystal device can be reduced. Accordingly, the stress transferred to the crystal element 120 can be reduced, so it becomes possible to reduce fluctuation of the characteristics of the crystal device, for example fluctuation of the frequency-temperature characteristic, that is, hysteresis.

Further, the second center point P2 of the recessed part K2 is provided in a direction opposite to the direction where the electrode pads 111 are provided relative to the first center point P1 of the substrate 110a in a plane perspective view. That is, the first center point P1 of the substrate and the second center point P2 of the recessed part K2 are provided at positions where they do not overlap when viewed on a plane. By doing this, in a plane perspective view, the electrode pads 111 and the recessed part K2 become further harder to overlap. Therefore, the thickness in the vertical direction at the position where the electrode pads 111 are provided formed by the substrate 110a and the mounting frame 110c added together is sufficiently secured, so the stress generated due to expansion or contraction of the substrate 110a along with a change of the surrounding temperature of the crystal device can be further reduced. Accordingly, the stress transferred to the crystal element 120 can be reduced, so it becomes possible to further reduce fluctuation of the characteristics of the crystal device, for example fluctuation of the frequency-temperature characteristic, that is, hysteresis.

The shape of the opening of the recessed part K2 becomes rectangular when viewed on a plane. Here, the size of the opening of the recessed part K2 will be explained by taking as an example the case where the dimension of the long sides of the substrate 110a in a planar view is 1.2 to 2.5 mm and the dimension of the short sides of the substrate 110a in a planar view is 1.0 to 2.0 mm. The length of the long sides of the recessed part K2 is 0.6 to 1.6 mm, and the length of the short sides becomes 0.3 to 1.0 mm.

Here, a method for preparing the substrate 110a will be explained. If the substrate 110a is made of alumina ceramic, first, a suitable organic solvent etc. is added to and mixed with a predetermined ceramic material powder to prepare a plurality of ceramic green sheets. Further, the surfaces of the ceramic green sheets or the insides of via holes provided in advance in the ceramic green sheets by punching or the like are coated with a predetermined conductor paste by conventionally known screen printing or the like. Further, these green sheets are stacked and press formed, then fired at a high temperature. Finally, predetermined portions of the connection patterns, specifically the portions forming the electrode pads 111, external terminals 112, interconnect patterns 113, via conductors 114, connection pads 117, connection patterns 118, and sealing-use conductor pattern 119 are nickel plated, gold plated, or plated with silver palladium or the like. Further, the conductor paste is configured by for example a sintered body of metal powder of for example tungsten, molybdenum, copper, silver, silver palladium, or the like.

Figure 2:
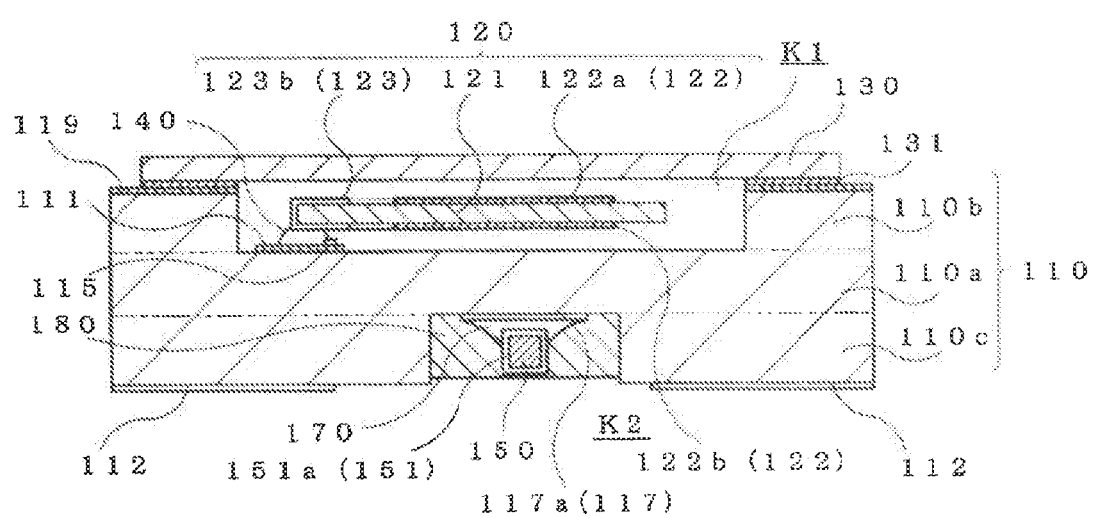
FIG. 2 is a cross-sectional view taken along II-II in FIG. 1.

The crystal element 120, as shown in FIG. 1 and FIG. 2, is bonded through a conductive adhesive 140 to the tops of the electrode pads 111. The crystal element 120 functions to generate the reference signal of the electronic apparatus etc. by its stable mechanical vibration and piezoelectric effect.

Further, the crystal element 120, as shown in FIG. 1 and FIG. 2, is structured with excitation electrodes 122 and lead electrodes 123 respectively fixed to the upper surface and lower surface of a crystal blank 121. The excitation electrodes 122 are formed by coating the upper surface and lower surface of the crystal blank 121 with metal in predetermined patterns. The excitation electrodes 122 include a first excitation electrode 122a on the upper surface and a second excitation electrode 122b on the lower surface. The lead electrodes 123 extend from the excitation electrodes 122 toward one side of the crystal blank 121.

The lead electrodes 123 include a first lead electrode 123a and second lead electrode 123b. The first lead electrode 123a is led out from the first excitation electrode 122a and is provided so as to extend out toward one side of the crystal blank 121. The second lead electrode 123b is led out from the second excitation electrode 122b and is provided so as to extend out toward one side of the crystal blank 121. That is, the lead electrodes 123 are provided in shapes that run along a long side or short side of the crystal blank 121. Further, in the present embodiment, the crystal element 120 is fixed on the substrate 110a by a cantilever support structure in which one end of the crystal element 120 connected to the first electrode pad 111a and second electrode pad 111b is formed as a fixed end connected with the upper surface of the substrate 110a and the other end is formed as a free end having a space from the upper surface of the substrate 110a.

Here, the operation of the crystal element 120 will be explained. The crystal element 120 is formed so that if an alternating voltage is supplied from the outside from the lead electrodes 123 through the excitation electrodes 122 to the crystal blank 121, the crystal blank 121 is excited by a predetermined vibration mode and frequency.

Here, the method for preparing the crystal element 120 will be explained. First, the crystal element 120 is cut from an artificial crystal at a predetermined cut angle and beveled for making the thickness thinner at the outer periphery of the crystal blank 121 so that the center part of the crystal blank 121 becomes thicker in comparison with the outer peripheral portion of the crystal blank 121. Further, the crystal element 120 formed with the excitation electrodes 122 and lead electrodes 123 by depositing metal films onto the two major surfaces of the crystal blank 121 by photolithography, vapor deposition, or sputtering.

The method for bonding the crystal element 120 to the substrate 110a will be explained. First, the conductive adhesive 140 is coated on the tops of first electrode pad 111a and second electrode pad 111b by for example a dispenser. The crystal element 120 is conveyed over the conductive adhesive 140 and is placed on the conductive adhesive 140. Further, the conductive adhesive 140 is heated to cure it whereupon it is hardened and contracts. The crystal element 120 is bonded to the electrode pads 111. That is, the first lead electrode 123a of the crystal element 120 is bonded to the first electrode pad 111a, while the second lead electrode 123b is bonded to the second electrode pad 111b. Due to this, the crystal element 120 is electrically connected with the first external terminal 112a and second external terminal 112b in the mounting frame 110c.

The conductive adhesive 140 is comprised of a silicone resin or other binder in which a conductive powder is contained as a conductive filler. As the conductive powder, one containing any of aluminum, molybdenum, tungsten, platinum, palladium, silver, titanium, and nickel or nickel iron or a combination of these may be used. Further, as the binder, use is made of for example a silicone resin, epoxy resin, polyimide resin, or bismaleimide resin.

The temperature sensing element 150 is mounted on the connection pads 117 provided in the recessed part K2. The long sides of the temperature sensing element 150 are arranged in the direction perpendicular to the long sides of the substrate 110a. By doing this, the first external terminal 112a electrically connected to the crystal element 120 can be made longer in interval from the first connection pad 117a, while the second external terminal 112b electrically connected to the crystal element 120 can made longer in interval from the second connection pad 117b. Therefore, even if the conductive bonding material 170 bonding the temperature sensing element 150 overflows, deposition of the conductive bonding material 170 onto the external terminals 112 can be suppressed. Accordingly, short-circuiting between the temperature sensing element 150 and the external terminals 112 electrically connected to the crystal element 120 can be reduced.

For the temperature sensing element 150, use is made of a thermistor, platinum resistance temperature detector, diode, etc. In the case of a thermistor element, the temperature sensing element 150 is rectangular in shape and is provided with connection terminals 151 on its two ends. The temperature sensing element 150 remarkably changes in electrical resistance according to a temperature change. The voltage changes due to the change of the resistance value. Therefore, using the relationship between the resistance value and the voltage and the relationship between the voltage and the temperature, it is possible to obtain temperature information from the voltage which is output. The voltage between connection terminals 151 explained later in the temperature sensing element 150 is output through the third external terminal 112c and fourth external terminal 112d on the mounting frame 110c to the outside of the crystal device. Due to this, temperature information can be obtained by converting the output voltage to temperature by a main IC (not shown) of an electronic apparatus etc. This such temperature sensing element 150 are arranged near the crystal device, thus the voltage driving the crystal device can be controlled by the main IC in accordance with the temperature information of the crystal device obtained by this for so-called "temperature compensation".

Further, if a platinum resistance temperature detector is used, in the temperature sensing element 150, platinum electrodes are provided by vapor deposition of platinum at the center of the top of a rectangular cuboid shaped ceramic board. Further, connection terminals 151 are provided at the two ends of the ceramic board. The platinum electrodes and the connection terminals are connected by lead electrodes provided on the upper surface of the ceramic board. An insulating resin is provided so as to cover the upper surface of the platinum electrodes.

Further, if a diode is used, the temperature sensing element 150 is structured as a semiconductor element mounted on upper surface of a semiconductor element-use substrate with the semiconductor element and the upper surface of the semiconductor element-use substrate coated by an insulating resin. Connection terminals 151 for forming an anode terminal and cathode terminal are provided from the lower surface to the side surfaces in the semiconductor element-use substrate. The temperature sensing element 150 has a forward characteristic making current flow from the anode terminal to the cathode terminal, but making almost no current flow from the cathode terminal to the anode terminal. The forward characteristics of the temperature sensing element greatly change according to the temperature. By making a constant current flow in the temperature sensing element and measuring the forward voltage, voltage information can be obtained. By conversion from that voltage information, the temperature information of the crystal element can be obtained. A diode exhibits a linear relationship between the voltage and the temperature. The voltage between the cathode terminal and the anode terminal of the connection terminals 151 is output through the third external terminal 112c and fourth external terminal 112d to the outside of the crystal device.

The temperature sensing element 150, as shown in FIG. 2 and FIGS. 4A and 4B, is mounted on the connection pads 117 provided on the lower surface of the substrate 110a through a conductive bonding material 170 made of solder or the like. Further, the first connection terminal 151a in the temperature sensing element 150 is connected to the first connection pad 117a. Further, the second connection terminal 151b in the temperature sensing element 150 is connected to the second connection pad 117b. The second connection pad 117b is connected through the second connection pattern 118b provided on the lower surface of the substrate 110a with the third external terminal 112c. Further, the third external terminal 112c functions as a ground terminal by connection with the mounting pad connected to the ground having the reference potential on the mounting substrate of the electronic apparatus or the like. Accordingly, the first connection terminal 151a in the temperature sensing element 150 ends up being connected to the ground having the reference potential.

The method for bonding the temperature sensing element 150 to the substrate 110a will be explained next. First, a conductive bonding material 170 is coated on the connection pads 117 by for example a dispenser. The temperature sensing element 150 is placed on the conductive bonding material 170. Further, the conductive bonding material 170 is heated for melt bonding. Accordingly, the temperature sensing element 150 is bonded to the connection pads 117.

Further, if the temperature sensing element 150 is a thermistor element, as shown in FIG. 1 and FIG. 2, one connection terminal 151 is provided at each of the two ends of the rectangular cuboid shape. The first connection terminal 151a is provided at the right side surface of the temperature sensing element 150 and the surfaces connected to that right side surface. Further, the second connection terminal 151b is provided at the left side surface of the temperature sensing element 150 and the surfaces connected to that left side surface. The length of the long sides of such a temperature sensing element 150 is 0.4 to 0.6 mm, and the length of the short sides becomes 0.2 to 0.3 mm. The length in the thickness direction of the temperature sensing element 150 becomes 0.1 to 0.3 mm.

The conductive bonding material 170 is configured by for example silver paste or lead-free solder. Further, the conductive bonding material 170 contains a solvent added for adjusting the viscosity for easy coating. Use is made of the lead-free solder having a component ratio of 95 to 97.5% of tin, 2 to 4% of silver, and 0.5 to 1.0% of copper.

The insulating resin 180 is for keeping solder or the like used when mounting on the mounting substrate of an electronic apparatus or the like from depositing on the temperature sensing element 150 while reducing short-circuiting between the connection terminals 151 in the temperature sensing element 150 and the external terminals 112 in the mounting frame 110c. Further, when mounting such a crystal device on the mounting substrate of a module part and forming a mold resin, if the mold resin enters into the recessed part K2 and the temperature sensing element 150 is covered in a state where a void is formed in the mold resin, sometimes air in the void will expand due to application of heat to this crystal device causing the temperature sensing element 150 to peel off or the like. Accordingly, by covering the temperature sensing element 150 by the insulating resin 180, the mold resin can be prevented from covering the temperature sensing element 150, therefore it becomes possible to keep the temperature sensing element 150 from peeling off from the connection pad 117.

Next, in the method of coating the insulating resin 180, the insulating resin 180 is filled in an uncured state through the opening of the recessed part K2 onto the surface of the temperature sensing element 150 and between the temperature sensing element 150 and the substrate 110a. The filling is carried out by for example a dispenser. Further, the insulating resin 180 is provided also on the periphery of the conductive bonding material 170 bonding the temperature sensing element 150, therefore short-circuiting with other electronic parts mounted in the electronic apparatus or the like due to the deposition of solder or the like can be reduced.

The lid 130 is made of for example an alloy containing at least one of iron, nickel, or cobalt. Such a lid 130 is for air-tightly sealing the holding part K1 in a vacuum state or the holding part K1 filled with nitrogen gas or the like. Specifically, the lid 130 is placed on the frame 110b of the package 110 in a predetermined atmosphere and a predetermined current is supplied for seam welding so as to weld the sealing-use conductor pattern 119 of the frame 110b and the bonding member 131 of the lid 130 whereby the lid is bonded to the frame 110b. Further, the lid 130 is electrically connected through the sealing-use conductor pattern 119 and third via conductor 114c with the third external terminal 112c on the lower surface of the mounting frame 110c. Accordingly, the lid 130 is electrically connected with the third external terminal 112c in the package 110.

The bonding member 131 is provided at a position at the lid 130 which faces the sealing-use conductor pattern 119 provided on the upper surface of the frame 110b in the package 110. The bonding member 131 is provided by for example silver solder or gold-tin. In the case of silver solder, the thickness is 10 to 20 μm. For example, use is made of solder having a component ratio of 72 to 85% or silver and 15 to 28% of copper. In the case of gold-tin, the thickness is 10 to 40 μm. For example, use is made of solder having a component ratio of 78 to 82% of gold and 18 to 22% of tin.

The crystal device in the present embodiment is provided with a rectangular-shaped substrate 110a, a mounting frame 110c which is provided along the outer circumferential edge of the lower surface of the substrate 110a on its short-side sides and is used for forming the recessed part K2, electrode pads 111 provided on the upper surface of the substrate 110a, connection pads 117 provided on the lower surface of the substrate 110a inside the mounting frame 110c, a crystal element 120 mounted on the electrode pads 111, a temperature sensing element 150 mounted on the connection pads 117, and a lid 130 for air-tightly sealing the crystal element 120. When viewed on a plane, the electrode pads 111 and the recessed part K2 do not overlap.

In such a crystal device, since the electrode pads 111 and the recessed part K2 do not overlap with each other, at the position where the electrode pads 111 are provided, the thickness in the vertical direction obtained by adding the substrate 110a and the mounting frame 110c is secured, therefore the stress generated due to the expansion or contraction of the substrate 110a along with a change of the surrounding temperature of the crystal device can be reduced. Accordingly, the stress transferred to the crystal element 120 can be reduced, so it becomes possible to reduce fluctuation of the characteristics of the crystal device, for example fluctuation of the frequency-temperature characteristic, that is, hysteresis.

Further, in the crystal device according to the present embodiment, the temperature sensing elements 150 are arranged in the direction perpendicular to the long sides of the substrate 110a. By doing this, the first external terminal 112a electrically connected with the crystal element 120 can be made longer in interval from the first connection pad 117a, and the second external terminal 112b connected with the crystal element 120 can be made longer in interval from the second connection pad 117b. Therefore, even if the conductive bonding material 170 bonding the temperature sensing element 150 overflows, deposition of the conductive bonding material 170 to the external terminals 112 can be suppressed. Accordingly, short-circuiting between the temperature sensing element 150 and the external terminals 112 electrically connected with the crystal element 120 can be reduced.

Further, in the crystal device in the present embodiment, the second center point P2 of the recessed part K2 is provided in the direction opposite to the direction for providing the electrode pads 111 relative to the first center point P1 of the substrate 110a in a plane perspective view. By doing this, in a plane perspective view, the electrode pads 111 and the recessed part K2 become further harder to overlap. Therefore, the thickness in the vertical direction at the position where the electrode pads 111 are provided formed by the substrate 110a and the mounting frame 110c added together is sufficiently secured, therefore stress generated due to expansion or contraction of the substrate 110a along with a change of the surrounding temperature of the crystal device can be reduced. Accordingly, the stress transferred to the crystal element 120 can be reduced, so it becomes possible to reduce fluctuation of the characteristics of the crystal device, for example fluctuation of the frequency-temperature characteristic, that is, hysteresis.

Further, the crystal device in the present embodiment is provided with the insulating resin 180 provided so as to cover the temperature sensing element 150. In such a crystal device, the temperature sensing element 150 is protected by the insulating resin 180, therefore deposition of metal scraps at the temperature sensing element 150 causing short-circuiting between the connection terminals 151 can be suppressed.

First Modification

Below, a crystal unit in a modification of the present embodiment will be explained. Note that, in the crystal unit in the modification of the present embodiment, parts similar to the crystal unit explained above will be assigned the same notations and explanations will be suitably omitted. The crystal device according to the first modification of the present embodiment, as shown in FIG. 5 to FIG. 9, is different in the point that a mounting frame 260 is formed separately from a package 210.

Figure 9A:
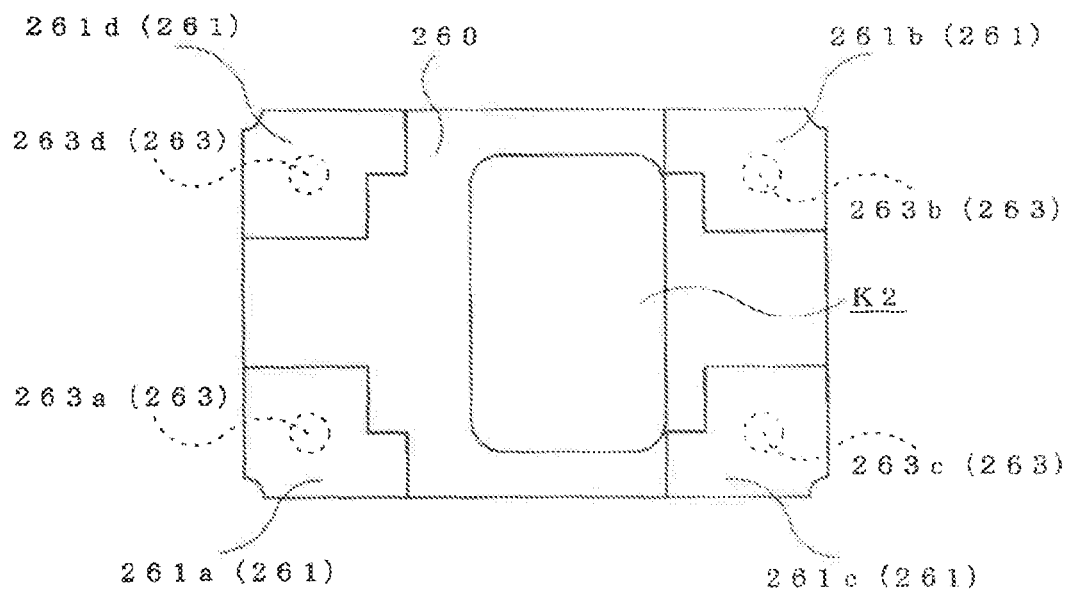
FIG. 9A is a perspective plan view when amounting frame configuring the crystal device according to the first modification of the present embodiment is viewed from the upper surface.
Figure 9B:
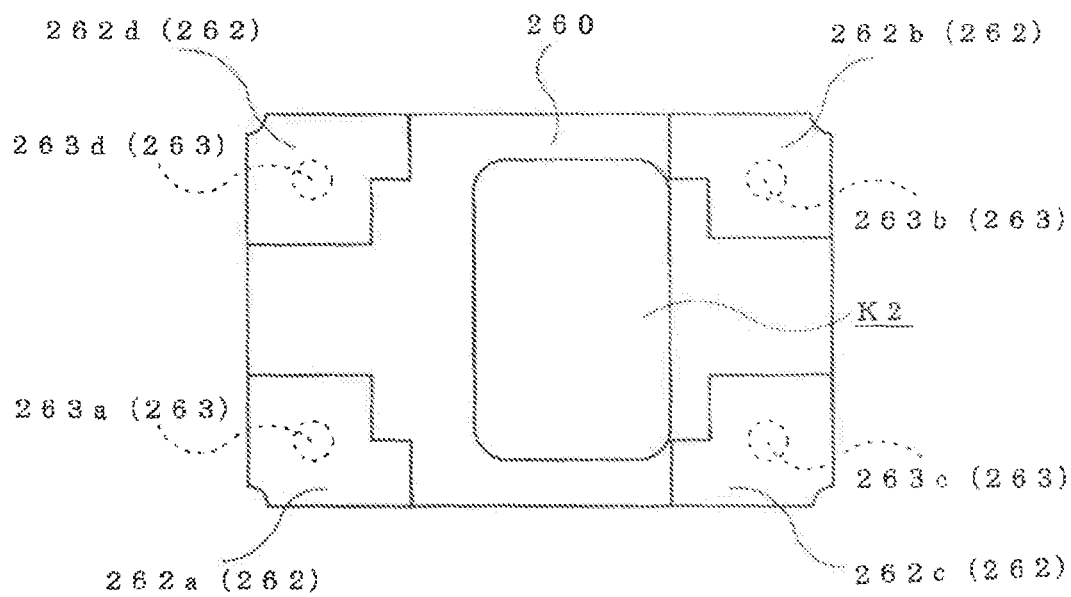
FIG. 9B is a perspective plan view when the mounting frame configuring the crystal device according to the first modification of the present embodiment is viewed from the upper surface.

The mounting frame 260 is bonded along the outer circumferential edge of the lower surface of a substrate 210a and is used for forming a recessed part K2 at the lower surface of the substrate 210a. The mounting frame 260 is configured by for example a glass epoxy resin or other insulating substrate and is bonded through the conductive bonding material 170 to the lower surface of the substrate 210a. In the internal portion of the mounting frame 260, as shown in FIGS. 9A and 9B, conductor parts 263 for electrically connecting bonding pads 261 provided on the upper surface and external terminals 262 provided on the lower surface of the mounting frame 260 are provided.

The bonding pads 261 are provided at the upper surface of the mounting frame 260, while the external terminals 262 are provided at the two ends of the lower surface. Further, two among the four external terminals 262 are electrically connected with the crystal element 120 and used as input/output terminals of the crystal element 120. Further, two among the four external terminals 262 are electrically connected with the temperature sensing element 150. Further, a first external terminal 262a and second external terminal 262b which are electrically connected to the crystal element 120 are provided so as to be positioned at the diagonal corners of the lower surface of the mounting frame 260. Further, a third external terminal 262c and fourth external terminal 262d which are electrically connected to the temperature sensing element 150 are provided so as to be positioned at the diagonal corners of the mounting frame 260 different from the diagonal corners at which the first external terminal 262a and second external terminal 262b connected to the crystal element 120 are provided.

The bonding pads 261 are electrically bonded with the bonding terminals 212 in the substrate 210a through the conductive bonding material 170. The bonding pads 261, as shown in FIG. 9A, are configured by a first bonding pad 261a, second bonding pad 261b, third bonding pad 261c, and fourth bonding pad 261d.

The external terminals 262 are for mounting the crystal device on the mounting substrate of an electronic apparatus or the like. The external terminals 262 are provided on the lower surface of the mounting frame 260. Two terminals among the external terminals 262 are electrically connected with the pair of electrode pads 211 provided on the upper surface of the substrate 210a. The remaining two terminals among the external terminals 262 are electrically connected with the connection pads 215 provided on the lower surface of the substrate 210a. Further, a third external terminal 262c is connected with the mounting pad connected to the ground potential having the reference potential on the mounting substrate of the electronic apparatus or the like. Due to this, the lid 130 bonded to the sealing-use conductor pattern 219 is connected to the third external terminal 262c having the ground potential. Accordingly, the sealing property in the holding part K1 by the lid 130 is improved.

Further, the external terminals 262, as shown in FIG. 9B, are configured by a first external terminal 262a, second external terminal 262b, third external terminal 262c, and fourth external terminal 262d. The conductor parts 263 are configured by a first conductor part 263a, second conductor part 263b, third conductor part 263c, and fourth conductor part 263d. The first bonding pad 261a is electrically connected through the first conductor part 263a with the first external terminal 262a, while the second bonding pad 261b is electrically connected through the second conductor part 263b with the second external terminal 262b. The third bonding pad 261c is electrically connected through the third conductor part 263c with the third external terminal 262c, while the fourth bonding pad 261d is electrically connected through the fourth conductor part 263d with the fourth external terminal 262d.

The conductor parts 263 are for electrically connecting the bonding pads 261 on the upper surface of the mounting frame 260 and the external terminals 262 on the lower surface of the mounting frame 260. The conductor parts 263 are formed by providing via holes at the four corners of the mounting frame 260, forming conductive members on the inner wall surfaces of the via holes, closing the upper surfaces thereof by the bonding pads 261, and closing the lower surfaces thereof by the external terminals 262.

The connection pads 217, in a plane perspective view, are provided so as to be offset in the direction opposite to the direction in which the electrode pads 211 are provided relative to the first center point P1 of the substrate 210a. The connection pads 217 are configured by a first connection pad 217a and a second connection pad 217b.

Figure 6:
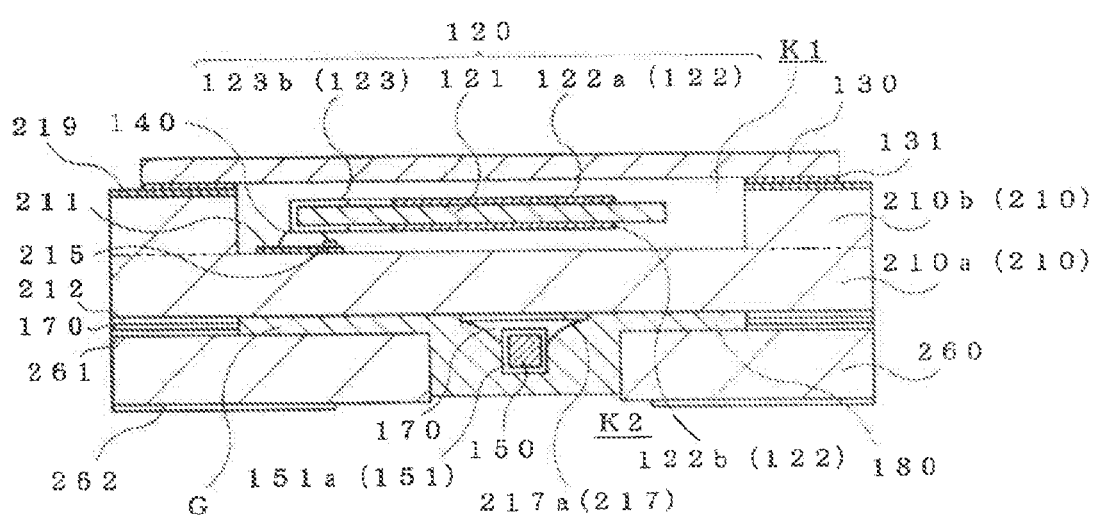
FIG. 6 is a cross-sectional view taken along VI-VI in FIG. 5.
Figure 7A:
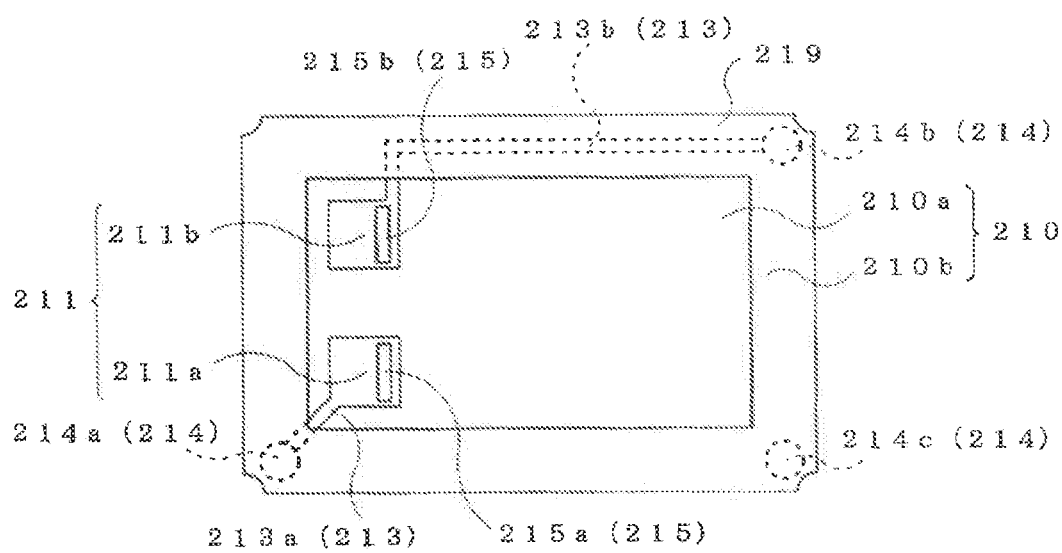
FIG. 7A is a perspective plan view when a package configuring the crystal device according to the first modification of the present embodiment is viewed from the upper surface.
Figure 7B:
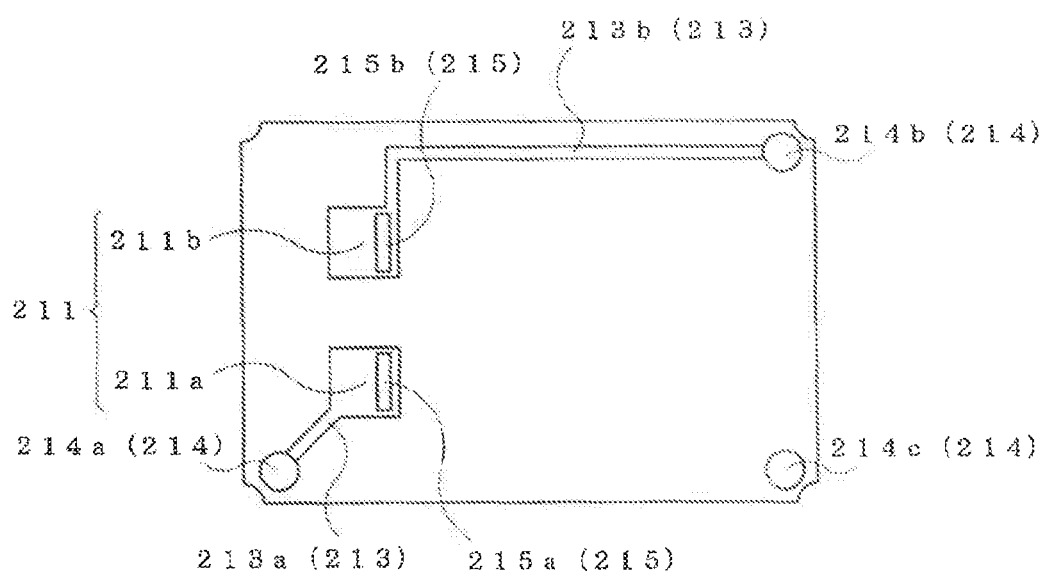
FIG. 7B is a perspective plan view when a substrate of the package configuring the crystal device according to the first modification of the present embodiment is viewed from the upper surface.
Figure 8A:
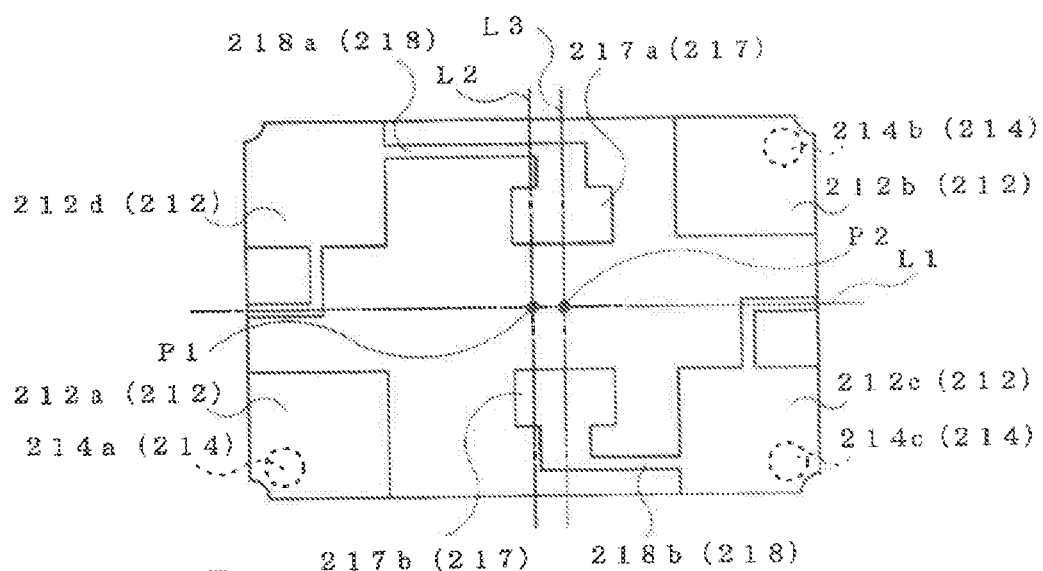
FIG. 8A is a perspective plan view when the substrate of the package configuring the crystal device according to the first modification of the present embodiment is viewed from the upper surface.
Figure 8B:
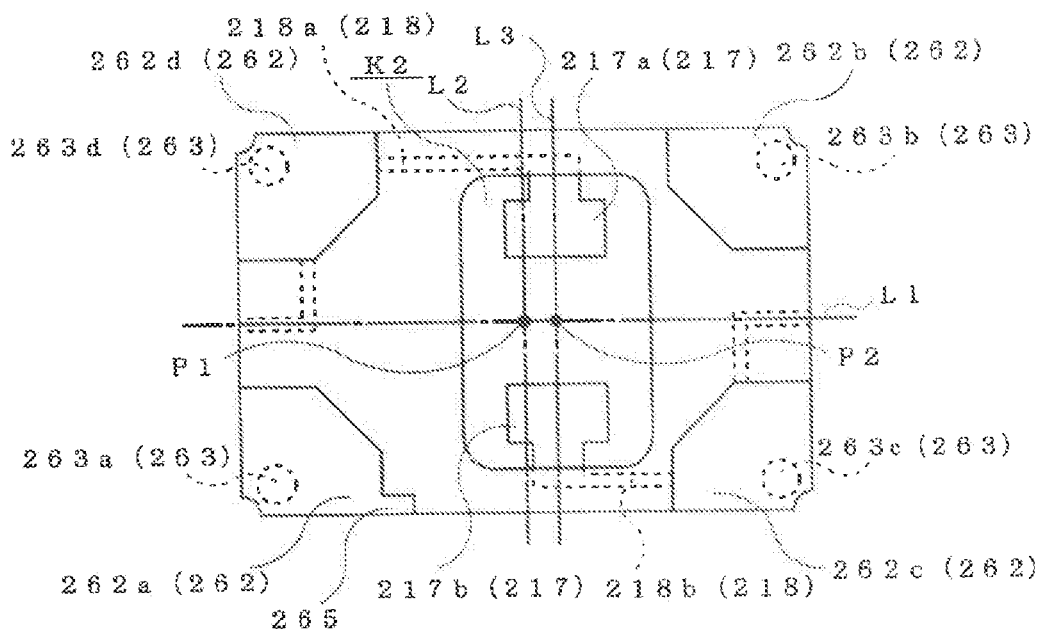
FIG. 8B is a perspective plan view when the crystal device according to the first modification of the present embodiment is viewed from the upper surface.

Further, by bonding the bonding terminals 212 on the substrate 210a and the bonding pads 261 on the mounting frame 260 through the conductive bonding material 170, as shown in FIG. 6 and FIGS. 8A and 8B, a gap portion G of an amount of the thickness of the conductive bonding material 170 and the thicknesses of the bonding terminals 212 and bonding pads 261 added together is provided between the substrate 210a and the mounting frame 260, and the insulating resin 180 coating the temperature sensing element 150 is provided in that gap portion G. Due to this, for example, when the crystal unit in the present embodiment is mounted on the mounting substrate of an electronic apparatus or the like, even if another electronic part such as a power amplifier mounted on this mounting substrate generates heat and that heat is transferred through the mounting substrate to the interior of the recessed part K2, that heat is transferred to the insulating resin 180 in the recessed part K2 and released to the outside since the insulating resin 180 provided in the gap portion G is exposed to the outside. By doing this, the influence of heat on the temperature sensing element 150 mounted in the recessed part K2 can be mitigated. Accordingly, such a crystal unit can reduce a difference between the temperature obtained by converting the voltage output from the temperature sensing element 150 and the actual temperature on the periphery of the crystal element 120.

The insulating resin 180 is provided in such a gap portion G, therefore the temperature sensing element 150 is reliably fastened by the insulating resin 180, so peel-off of the temperature sensing element 150 from the substrate 210a can be reduced.

Here, the method for preparing the mounting frame 260 will be explained. If the mounting frame 260 is made of a glass epoxy resin, it is fabricated by impregnating a precursor of epoxy resin into a base material configured by glass fiber and heating this epoxy resin precursor to cure at a predetermined temperature. Further, predetermined portions of the conductor patterns, specifically the bonding pads 261 and external terminals 262, are for example formed by transferring copper foil worked to a predetermined shape onto resin sheets made of glass epoxy resin, stacking the resin sheets to which the copper foil is transferred, and bonding them by an adhesive. Further, the conductor parts 263 are formed by depositing metal at the inner surfaces of the via holes formed in the resin sheets by printing a conductor paste or plating or are formed by filling metal into the via holes. Such conductor parts 263 are formed by for example integrally forming metal foils or metal posts by resin molding or by deposition by sputtering, vapor deposition, or the like.

In the crystal device according to the first modification of the present embodiment, the gap portion G is provided between the mounting frame 260 and the substrate 210a. Due to this, when the crystal device of the present embodiment is mounted on the mounting substrate of an electronic apparatus or the like, even if another electronic part such as a power amplifier mounted on this mounting substrate generates heat and that heat is transferred through the mounting substrate to the interior of the recessed part K2, that heat is transferred to the interior of the recessed part K2, and the heat is released to the outside by the gap portion G. By doing this, the influence of heat on the temperature sensing element 150 mounted in the recessed part K2 can be mitigated. Accordingly, such a crystal unit can reduce a difference between the temperature obtained by converting the voltage output from the temperature sensing element 150 and the actual temperature on the periphery of the crystal element 120.

In the crystal device according to the first modification of the present embodiment, the insulating resin 180 is provided in the gap portion G. Due to this, when the crystal device according to the first modification of the present embodiment is mounted on the mounting substrate of an electronic apparatus or the like, even if another electronic part such as a power amplifier mounted on this mounting substrate generates heat and that heat is transferred through the mounting substrate to the interior of the recessed part K2, that heat is transferred to the insulating resin 180 in the recessed part K2, and the heat is released to the outside since the insulating resin 180 provided in the gap portion G is exposed to the outside. By doing this, the influence of heat on the temperature sensing element 150 mounted in the recessed part K2 can be further mitigated. Accordingly, such a crystal unit can reduce a difference between the temperature obtained by converting the voltage output from the temperature sensing element 150 and the actual temperature on the periphery of the crystal element 120.

Further, in the crystal device according to the first modification of the present embodiment, the insulating resin 180 is provided in the gap portion G. In this way, the temperature sensing element 150 is reliably fastened by the insulating resin 180, therefore peel-off of the temperature sensing element 150 from the substrate 210a can be reduced.

Second Modification

Figure 10:
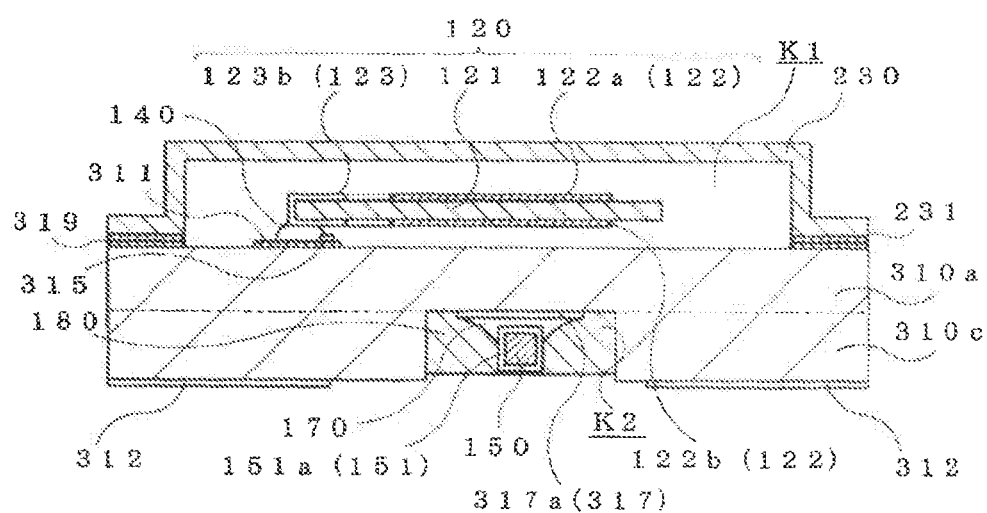
FIG. 10 is a cross-sectional view showing a crystal device according to a second modification of the present embodiment.

Below, a crystal device in a second modification of the present embodiment will be explained. Note that, in the crystal device in the second modification of the present embodiment, parts similar to the crystal unit explained above will be assigned the same notations and explanations will be suitably omitted. The crystal device according to the second modification of the present embodiment, as shown in FIG. 10, is different in the point that a holding part is not provided in the package but the holding part K1 is provided in a lid 230.

The lid 230 is made of for example an alloy containing at least one of iron, nickel, or cobalt. The outer shape of the lid 230 is a shape obtained by turning a box shaped member provided with the holding part K1 upside down and making the portion contacting a sealing-use conductor pattern 319 formed on a substrate 310a an L-shaped flange. The lid 230 is placed on the upper surface of the substrate 310a so that its flange portion is made to contact a belt-shaped region of the sealing-use conductor pattern 319 formed on the inner side of the periphery of the substrate 310*a*, and the crystal element 120 is held in the holding part K1. Such a lid 230 is for air-tightly sealing the holding part K1 in a vacuum state or the holding part K1 filled with nitrogen gas or the like. Specifically, in the predetermined atmosphere, the lid 230 is placed on the upper surface of the substrate 310*a* and is bonded to the substrate 310*a* by seam welding supplying a predetermined current so that the sealing-use conductor pattern 319 on the substrate 310*a* and the sealing member 231 provided in the flange portion of the lid 230 are welded. Further, the lid 230 is electrically connected through the sealing-use conductor pattern 319 and a via conductor to a third external terminal on the lower surface of the mounting frame 160.

The sealing member 231 is provided in the flange portion of the lid 230 which faces the sealing-use conductor pattern 319 provided on the upper surface of the substrate 310*a*. The sealing member 231 is provided by for example silver solder or gold-tin. In the case of silver solder, the thickness is 10 to 20 µm. For example, use is made of a member having a component ratio of 72 to 85% of silver and 15 to 28% of copper. In the case of gold-tin, the thickness is 10 to 40 µm. For example, use is made of a member having a component ratio of 78 to 82% of gold and 18 to 22% of tin.

The crystal device according to the second modification of the present embodiment is provided with a rectangular shaped substrate 310*a*, a mounting frame 310*c* which is provided along the outer circumferential edge of the lower surface of the substrate 310*a* on its short-side sides and is used for forming the recessed part K2, electrode pads 311 provided on the upper surface of the substrate 310*a*, connection pads 317 provided on the lower surface of the substrate 310*a* inside the mounting frame 310*c*, a crystal element 120 mounted on the electrode pads 311, a temperature sensing element 150 mounted on the connection pads 317, and a lid 230 for air-tightly sealing the crystal element 120. In a plane perspective view, the electrode pads 311 and the recessed part K2 are provided at positions where they do not overlap. By the electrode pads 311 and the recessed part K2 being provided at positions where they do not overlap in this way, the thickness in the vertical direction at the position where the electrode pads 311 are provided formed by the substrate 310*a* and the mounting frame 310*c* added together is sufficiently secured, therefore stress generated due to expansion or contraction of the substrate 310*a* along with a change of the surrounding temperature of the crystal device can be reduced. Accordingly, the stress transferred to the crystal element 120 can be reduced, so it becomes possible to reduce fluctuation of the characteristics of the crystal device, for example fluctuation of the frequency-temperature characteristic, that is, hysteresis.

The crystal device configured as described above is mounted on the surface of a printed board of an electronic apparatus by fastening the bottom surfaces of the external terminals to the printed board by soldering, Au bumps, conductive adhesive, or the like. Further, the crystal device is used as an oscillation source in various electronic apparatuses such as personal computers, clocks, game machines, communication machines, and car-mounted devices such as car navigation systems. Even if the printed board is deformed in a state mounted in this way, the thickness in the vertical direction obtained by adding the substrate and the mounting frame which are located just under the electrode pads is sufficiently secured, therefore the stress is absorbed by the substrate and the mounting frame, so the stress acting upon the crystal element is reduced. Accordingly, it becomes possible for such an electronic apparatus to reduce the fluctuation of characteristic fluctuations of the crystal device, for example, the fluctuation of the frequency-temperature characteristic, that is, the hysteresis. Therefore, the temperature stability as the electronic apparatus can be secured.

Note that, the art is not limited to the present embodiments. Various alterations and improvements are possible. In the embodiments described above, a case using an AT-use crystal element as the crystal element was explained. However, use may be made of a tuning-fork type bent crystal element having a base part and two flat plate-shaped vibration arms extending from the side surfaces of the base part in the same direction as well.

In the embodiments described above, the case where the frame 110*b* was integrally formed by a ceramic material in the same way as the substrate 110*a* was explained. However, the frame 110*b* may be made of metal as well. In this case, the frame is bonded through a brazing material such as silver-copper to the conductor film of the substrate.

Priority is claimed on Japanese application No. 2018-072504, filed on Apr. 4, 2018, the contents of which is incorporated herein by reference.

REFERENCE SIGNS LIST 110, 210 . . . packages
110*a*, 210*a*, 310*a* . . . substrates
110*b*, 210*b*, 310*b* . . . frames
110*c*, 260, 310*c* . . . mounting frames
111, 211 . . . electrode pads
112, 262, 312 . . . external terminals
212 . . . bonding terminal
113, 213 . . . interconnect patterns
114, 214, 314 . . . via conductors
115, 215, 315 . . . convex portions
116 . . . projection part
117, 217, 317 . . . connection pads
118 218 . . . connection patterns
119, 219, 319 . . . sealing-use conductor patterns
261 . . . bonding pad
263 . . . conductor part
120 . . . crystal element
121 . . . crystal blank
122 . . . excitation electrode
123 . . . lead electrode
130, 230 . . . lids
131, 231 . . . bonding members
140 . . . conductive adhesive
150 . . . temperature sensing element
151 . . . connection terminal
180 . . . insulating resin
K1 . . . holding part
K2 . . . recessed part
G . . . gap portion

The invention claimed is:

1. A crystal device comprising
a rectangular shaped substrate,
a mounting frame which is along an outer circumferential edge of a lower surface of the substrate on its short-side sides and configures a recessed part,
electrode pads on an upper surface of the substrate,
connection pads on the lower surface of the substrate in the mounting frame,
a crystal element mounted on the electrode pads,
a temperature sensing element mounted on the connection pads, a lid air-tightly sealing the crystal element, and four external terminals, a different one of the four external terminals are provided at each corner of a lower surface of the mounting frame, wherein the electrode pads and the recessed part do not overlap in a plane perspective view, a second center point of the recessed part is located in a direction opposite to a direction in which the electrode pads are located relative to a first center point of the substrate in a plane perspective view, a first external terminal of the four external terminals located on a side in which the electrode pads are located comprises a projection part, the projection part protrudes toward the first center point in a direction along a long side of the substrate, the first external terminal is longer than any other of the four external terminals in the direction along the long side of the substrate, and the projection part is a mark of the four external terminals and is only connected to the first external terminals and is not mounted with an electronic component.

2. The crystal device according to claim 1, wherein the temperature sensing element is located in a direction perpendicular to long sides of the substrate.

3. The crystal device according to claim 1, wherein the temperature sensing element is coated by an insulating resin.

4. The crystal device according to claim 1, wherein a gap portion is located between the mounting frame and the substrate.

5. The crystal device according to claim 4, wherein an insulating resin is located in the gap portion.

6. An electronic apparatus comprising the crystal device according to claim 1.

7. A crystal device comprising
a rectangular shaped substrate,
a mounting frame which is along an outer circumferential edge of a lower surface of the substrate on its short-side sides and configures a recessed part,
electrode pads on an upper surface of the substrate,
connection pads on the lower surface of the substrate in the mounting frame,
a crystal element mounted on the electrode pads,
a temperature sensing element mounted on the connection pads, and
a lid air-tightly sealing the crystal element, wherein
the electrode pads and the recessed part do not overlap in a plane perspective view,
wherein a gap portion is located between the mounting frame and the substrate, and
wherein an insulating resin is located in the gap portion.

8. The crystal device according to claim 7, wherein the temperature sensing element is located in a direction perpendicular to long sides of the substrate.

9. The crystal device according to claim 7, wherein a second center point of the recessed part is located in a direction opposite to a direction in which the electrode pads are located relative to a first center point of the substrate in a plane perspective view.

10. The crystal device according to claim 7, wherein the temperature sensing element is coated by an insulating resin.

11. An electronic apparatus comprising the crystal device according to claim 7.

* * * * *